United States Patent
Tao et al.

(10) Patent No.: US 7,002,257 B2
(45) Date of Patent: Feb. 21, 2006

(54) OPTICAL COMPONENT PACKAGE AND PACKAGING INCLUDING AN OPTICAL COMPONENT HORIZONTALLY ATTACHED TO A SUBSTRATE

(75) Inventors: Su Tao, Kaohsiung (TW); Kuo-Chung Yee, Taipei (TW); Jen-Chieh Kao, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/463,578

(22) Filed: Jun. 18, 2003

(65) Prior Publication Data

US 2004/0104488 A1    Jun. 3, 2004

(30) Foreign Application Priority Data

Dec. 3, 2002    (TW) ................ 91135097 A

(51) Int. Cl.
*H01L 23/28*    (2006.01)
(52) U.S. Cl. .................... 257/787; 257/98; 257/686; 257/723; 257/777
(58) Field of Classification Search .............. 257/98, 257/99, 100, 709, 737, 738, 787, 685, 686, 257/723, 777, 778, 789, 788, 799, 792, 790, 257/704, 678, 784
See application file for complete search history.

(56) References Cited

U.S. PATENT DOCUMENTS

| | | | |
|---|---|---|---|
| 6,417,908 B1 * | 7/2002 | Nishiguchi et al. | 349/155 |
| 6,469,376 B1 * | 10/2002 | Vaiyapuri | 257/686 |
| 2003/0141582 A1 * | 7/2003 | Yang et al. | 257/686 |
| 2004/0080037 A1 * | 4/2004 | Foong et al. | 257/687 |
| 2004/0084760 A1 * | 5/2004 | Liu et al. | 257/686 |

* cited by examiner

Primary Examiner—Hoai Pham
Assistant Examiner—DiLinh Nguyen
(74) Attorney, Agent, or Firm—Bacon & Thomas, PLLC

(57) ABSTRACT

An optical component package includes a substrate, an optical component, a plurality of spacers, a plurality of wires, and a transparent molding compound. The optical component is disposed on the substrate, and the surface of the optical component located away from the substrate is used to receive an optical signal. The spacers are disposed between the substrate and optical component. The wires electrically connect the optical component to the substrate. The transparent molding compound encapsulates the optical component. In this case, the diameter of each of the spacers is equal to the thickness of the transparent molding compound minus the thickness of the optical component minus the distance between where the optical signal enters the transparent molding compound and where the optical signal is received by the optical component. Furthermore, this invention also discloses a packaging method for the optical component package.

20 Claims, 7 Drawing Sheets

OPTICAL COMPONENT PACKAGE AND PACKAGING INCLUDING AN OPTICAL COMPONENT HORIZONTALLY ATTACHED TO A SUBSTRATE

BACKGROUND OF THE INVENTION

1. Field of Invention

The present invention is generally related to a semiconductor package and packaging method thereof, and in particular, to an optical component package and packaging method thereof.

2. Related Art

Accompanying the development of optoelectronic technology and semiconductor fabrication technology, the application of optical signals for data transmission has become widespread. Furthermore, since the semiconductor packages have become smaller, optical components used to receive optical signals in optical component packages have resulted in a trend towards more compact devices.

Please refer to FIG. 1. A conventional optical component package 1 for receiving an optical signal includes a substrate 11, an optical component 12, a plurality of wires 13, and a transparent molding compound 14. In this case, the optical component 12 is attached to the substrate 11 with an adhesive 121, and one surface of the optical component 12 that receives the optical signal is located away from the substrate 11. The wires 13 electrically connect the pads of the optical component 12 to the pads of the substrate 11 so as to communicate circuits of the optical component 12 and the substrate 11. The transparent molding compound 14 is formed to encapsulate the optical component 12.

However, during the packaging processes of the optical component package 1, it is difficult to completely attach the optical component 12 horizontally to the substrate 11. In practice, the optical component 12 is usually tilted (as shown in FIG. 1). In such cases, as shown in FIG. 2, if an optical signal 20 is input to the optical component package 1, the optical signal 20 may not accurately focus on a surface of the optical component 12, which is an active zone 122 of the optical component 12 used to receive the optical signal 20, after passing through a lens 15. Therefore, the intensity of the optical signal 20 received by the active zone 122 is not strong enough, which in turn means the optical component 12 cannot correctly analyze the information of the optical signal 20.

To solve the previous mentioned problem, those skilled in the art replace the conventional adhesive with an adhesive film for the optical component attachment. Consequently, although the optical component could be attached horizontally, it is necessary to provide high temperature and high pressure for the adhesive film during an attachment process. Unfortunately, circuits of the optical component and substrate could suffer from the high temperature and high pressure, and the yield of the semiconductor products could be reduced. In addition, the adhesive film is more expensive than the conventional adhesive, so using the adhesive film to attach the optical component may increase the cost of the semiconductor products.

Hence, it is an important subjective of the invention to horizontally attach an optical component and accurately to focus optical signals on the active zone of the optical component.

SUMMARY OF THE INVENTION

In view of the above-mentioned problems, an objective of the invention is to provide an optical component package and packaging method thereof, which can allow an optical component to be attached horizontally to the respective package.

It is a further objective of the invention to provide an optical component package and packaging method thereof, which can accurately focus an optical signal on an active zone of an optical component.

To achieve the above-mentioned objectives, an optical component package includes a substrate, an optical component, a plurality of spacers, a plurality of wires, and a transparent molding compound. In the invention, the optical component is disposed on the substrate, and one surface of the optical component located away from the substrate receives an optical signal. The spacers are disposed between the substrate and optical component. The wires respectively connect the optical component to the substrate. The transparent molding compound encapsulates the optical component. Each of the spacers has a diameter equal to a thickness of the transparent molding compound minus a thickness of the optical component minus a distance between where the optical signal enters the transparent molding compound and where the optical signal is received by the optical component.

Furthermore, the invention also provides another optical component package, which includes a substrate, a semiconductor component, a plurality of first wires, an optical component, a plurality of spacers, a plurality of second wires, and a transparent molding compound. In this case, the semiconductor component is disposed on the substrate, and the optical component is formed on the semiconductor component. The first wires and second wires respectively connect the semiconductor component and optical component to the substrate. The spacers are disposed between the semiconductor component and the optical component. Each of the spacers has a diameter equal to a thickness of the transparent molding compound minus a thickness of the optical component minus a distance between where the optical signal enters the transparent molding compound and where the optical signal is received by the optical component minus a thickness of the semiconductor component.

Moreover, this invention further discloses a packaging method of an optical component package, which includes forming an adhesive containing a plurality of spacers on a substrate, mounting an optical component on the adhesive, forming a plurality of wires to electrically connect the optical component to the substrate, and forming a transparent molding compound to encapsulate the optical component. In the invention, one surface of the optical component located away from the substrate is to receive an optical signal. Each of the spacers has a diameter equal to a thickness of the transparent molding compound minus a thickness of the optical component minus a distance between where the optical signal enters the transparent molding compound and where the optical signal is received by the optical component.

As mentioned above, since the optical component package and packaging method thereof of the invention accurately calculate the diameter of each spacer for supporting the optical component, the optical component can be provided horizontally with the supporting of the spacers. Additionally, the diameter of each spacer is exactly controlled, so the optical signal can focus on the active zone of the optical component accurately.

BRIEF DESCRIPTION OF THE DRAWINGS

The invention will become more fully understood from the detailed description given herein below illustration only, and thus are not limitative of the present invention, and wherein.

DETAILED DESCRIPTION OF THE INVENTION

The optical component package and packaging method thereof according to the preferred embodiments of the invention will be described herein below with reference to the accompanying drawings, wherein the same reference numbers refer to the same elements.

Figure 1:
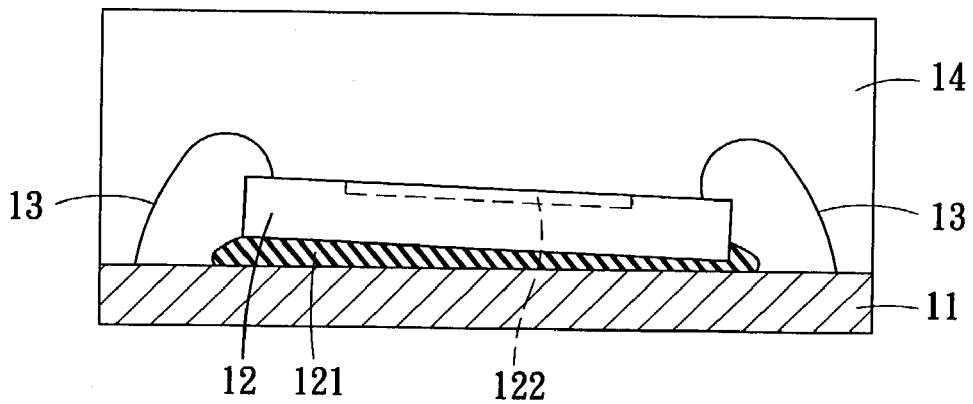
FIG. 1 is a schematic illustration showing a conventional optical component package.
Figure 2:
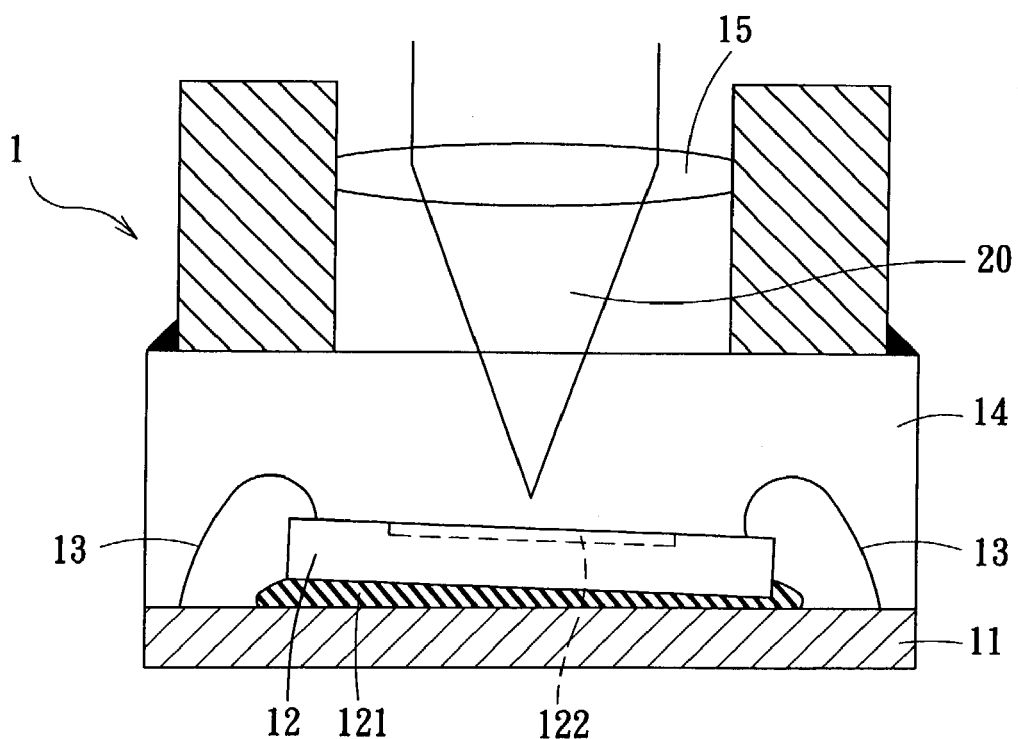
FIG. 2 is a schematic illustration showing an optical signal, which focuses on the conventional optical component package shown in FIG. 1 with a lens.
Figure 3:
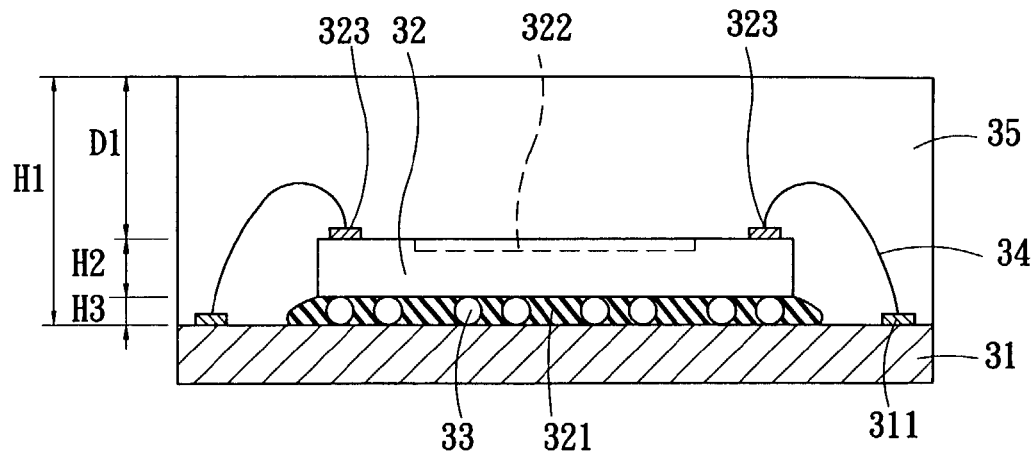
FIG. 3 is a schematic illustration showing an optical component package according to a preferred embodiment of the invention.

With reference to FIG. 3, an optical component package 3 according to a preferred embodiment of the invention includes a substrate 31, an optical component 32, a plurality of spacers 33, a plurality of wires 34, and a transparent molding compound 35.

The optical component 32 is disposed on the substrate 31. In the current embodiment, the optical component 32 is attached to the substrate 31 with an adhesive 321. The adhesive 321 can be any conventional adhesive such as a silver paste. An active zone 322 of the optical component 32 is located on one surface of the optical component 32 located away from the substrate 31, and is used to receive an optical signal (not shown).

The spacers 33 are disposed between the substrate 31 and optical component 32. In other words, the spacers are disposed in the adhesive 321. In the present embodiment, the diameter of each spacer 33 is equal to a thickness of the transparent molding compound 35 minus a thickness of the optical component 32 minus a distance between where the optical signal enters the transparent molding compound 35 and where the optical signal is received by the optical component 32. The spacers 33 can be made of a polymer or glass, which is cheap and available. Consequently, the cost of the spacers 33 is reduced, and the spacers 33 can easily manufactured within desired size.

The wires 34 electrically connect the optical component 32 to the substrate 31. In the embodiment, the substrate 31 may have a complex circuit (not shown), which performs data I/O through a plurality of pads 311. The optical component 32 has a plurality of pads 323 for communicating with external devices. Each of the wires 34 electrically connects each pad 323 to each corresponding pad 311. Therefore, the optical component 32 can output signals to or receive signals from the circuit of the substrate 31 via the wires 34. In addition, another surface of the substrate 31 is provided with a plurality of solder balls (not shown), so as to electrically connect to the external devices. Thus, the optical component 32 can further communicate with the external devices through the substrate 31. In such a case, the substrate 31 may be a ceramic substrate or a plastic substrate. In an addition case, the substrate 31 can be substituted with a lead frame.

The transparent molding compound 35, which encapsulates the optical component 32, is made of transparent materials.

As shown in FIG. 3, D1 is the distance between the surface of the transparent molding compound 35 and the surface of the optical component 32, which is the active zone 322. The thickness of the transparent molding compound 35 is H1, and that of the optical component 32 is H2. The diameter of each spacer 33 is H3. People skilled in the art should know that if an optical signal is input from the external devices to the optical component package 3, the optical signal will reach the transparent molding compound 35 after passing through a lens (not shown). Then, the optical signal will pass through the transparent molding compound 35 and focus on the surface of the optical component 32, which is the active zone 322. It should be noted that the optical signal passes through in the transparent molding compound 35 is D1, which those skilled in the art can predict. In addition, the thickness of transparent molding compound 35 is determined by the design of a molding device used in a molding process. Thus, the thickness H1 of the molding compound 35 is predictable by the skilled persons. The thickness of the optical component 32 can be exactly controlled with a backside grinding process. It is therefore that the thickness H2 is also predictable by those skilled in the art. As a result, people skilled in the art can determine the diameter H3 of each spacer 33 in accordance with the following equation (1):

$$H3 = H1 - D1 - H2 \tag{1}$$

Figure 4:
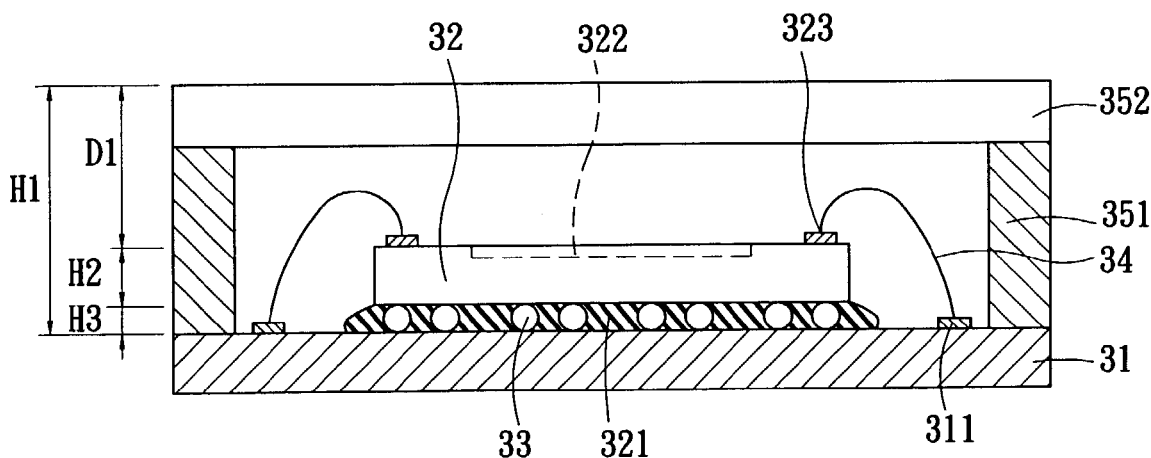
FIG. 4 is a schematic illustration showing an optical component package according to another preferred embodiment of the invention, wherein an optical component is encapsulated with a dam and a transparent lid.

Referring to FIG. 4, an optical component package 4 according to another preferred embodiment of the invention does not employ conventional molding compound to encapsulate the optical component 32. In this embodiment, a dam 351 and a transparent lid 352 are used to encapsulate the optical component 32. The dam 351 encompasses the optical component, and the transparent lid 352 is placed over the dam 351. In such a case, the mentioned optical signal (not shown) can pass through the transparent lid 352 and focus on the active zone 322 of the optical component 32. The dam 351 can be made of molding compounds, kovar alloy, or materials similar to the substrate 31.

Figure 5:
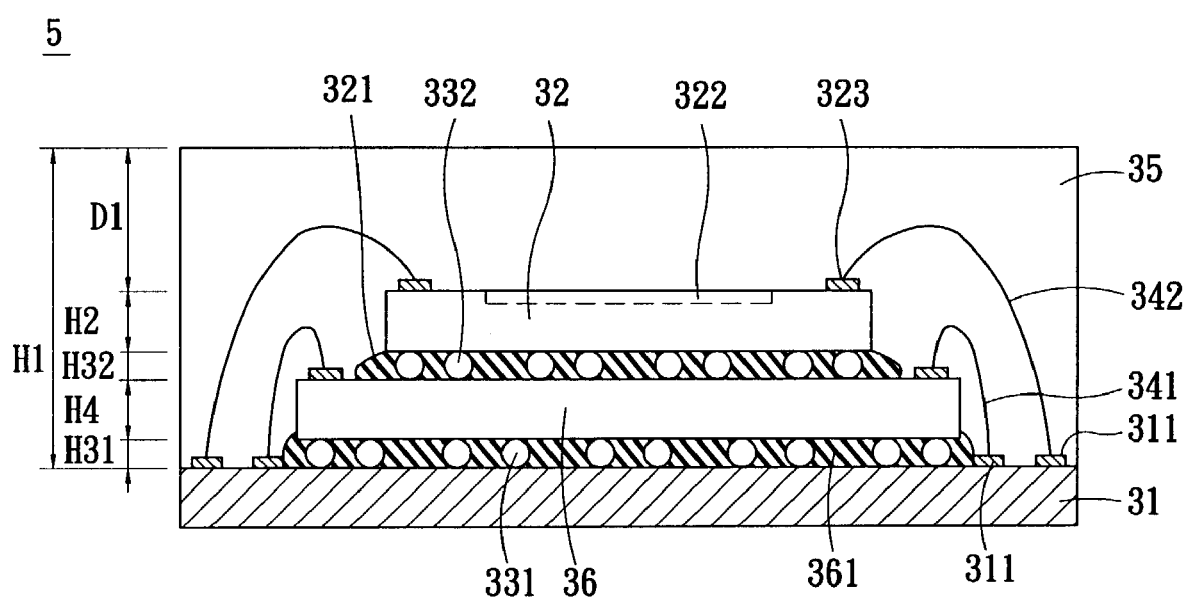
FIGS. 5 and 5A are schematic illustrations showing an optical component package according to yet another preferred embodiment of the invention, which is a stacked optical component package.
Figure 5A:
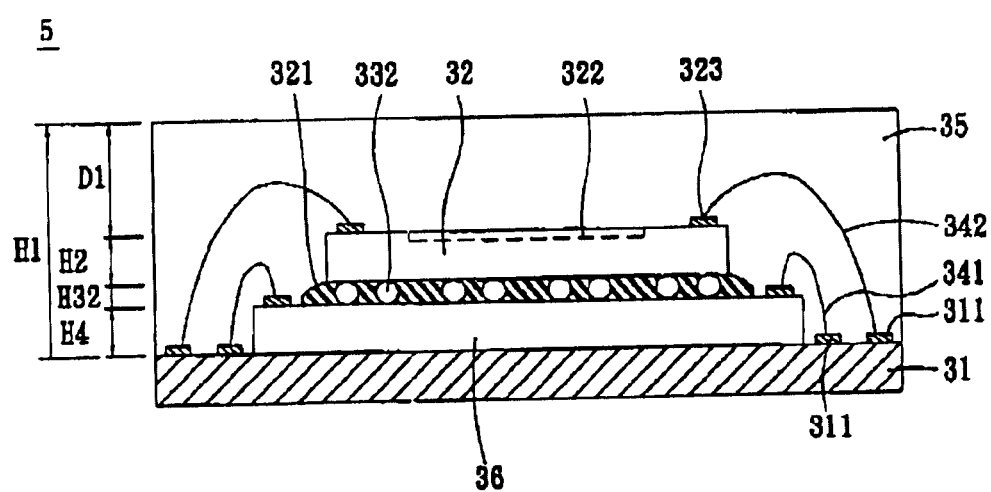

It should be noted that the invention is capable of being used in stacked semiconductor packages. As shown in FIG. 5A, an optical component package 5 according too another preferred embodiment of the invention includes a substrate 31, an optical component 32, a plurality of second spacers 332, a plurality of first wires 341, a plurality of second wires 342, a transparent molding compound 35, and a semiconductor component 36. In addition, the optical component package 5 may further include a plurality of first spacers disposed between the substrate 31 and the semiconductor component 36. As shown in FIG. 5, an optical component package 5 according to another preferred embodiment of the invention includes a substrate 31 an optical component 32, a plurality of first spacers 331, a plurality of second spacers 332, a plurality of first wires 341, a plurality of second wires 342, a transparent molding compound 35, and a semiconductor component 36.

In the current embodiment, the semiconductor component 36 is disposed on the substrate 31, and the optical component 32 is disposed to the semiconductor component 36. The semiconductor component 36 may be disposed on the substrate 31 directly as shown in FIG. 5A, and it maybe disposed on the substrate 31 with the first spacers 331 as shown in FIG. 5. The first spacers 331 (as shown in FIG. 5) are provided between the substrate 31 and semiconductor component 36, and the second spacers 332 (as shown in FIGS. 5A and 5) are provided between the semiconductor component 36 and optical component 32. In other words, the first spacers 331 are disposed in the adhesive 361, and the second spacers 332 are disposed in the adhesive 321. The first wires 341 bonds the semiconductor component 36 to the substrate 31, and the second wires 342 bonds the optical component 32 to the substrate 31. The transparent molding compound 35 encapsulates the optical component 32 and the semiconductor component 36.

As shown, the semiconductor component 36 is used as a logic semiconductor die with data processing functions. Thus, when the optical component 32 receives an optical signal, the signal can be transferred to the semiconductor component 36 through the substrate 31. The semiconductor component 36 can then deal with the signal, and output the calculated result through the substrate 31.

As shown in FIG. 5A. the thickness of the semiconductor component 36 is H4, which can be exactly controlled with a backside grinding process. Consequently. the diameter H32 of each spacer 332 can be determined in accordance with the following equation:

$$H32=H1-D1-H2-H4 \qquad (2')$$

In this embodiment (as shown in FIG. 5), each first spacer 331 has a diameter of H31, which can be predicted by those skilled in the art. The thickness of the semiconductor component 36 is H4, which can be exactly controlled with a backside grinding process. Consequently, the diameter H32 of each spacer 332 can be determined in accordance with the following equation (2):

$$H32=H1-D1-H2-H4H31 \qquad (2)$$

Figure 7A:
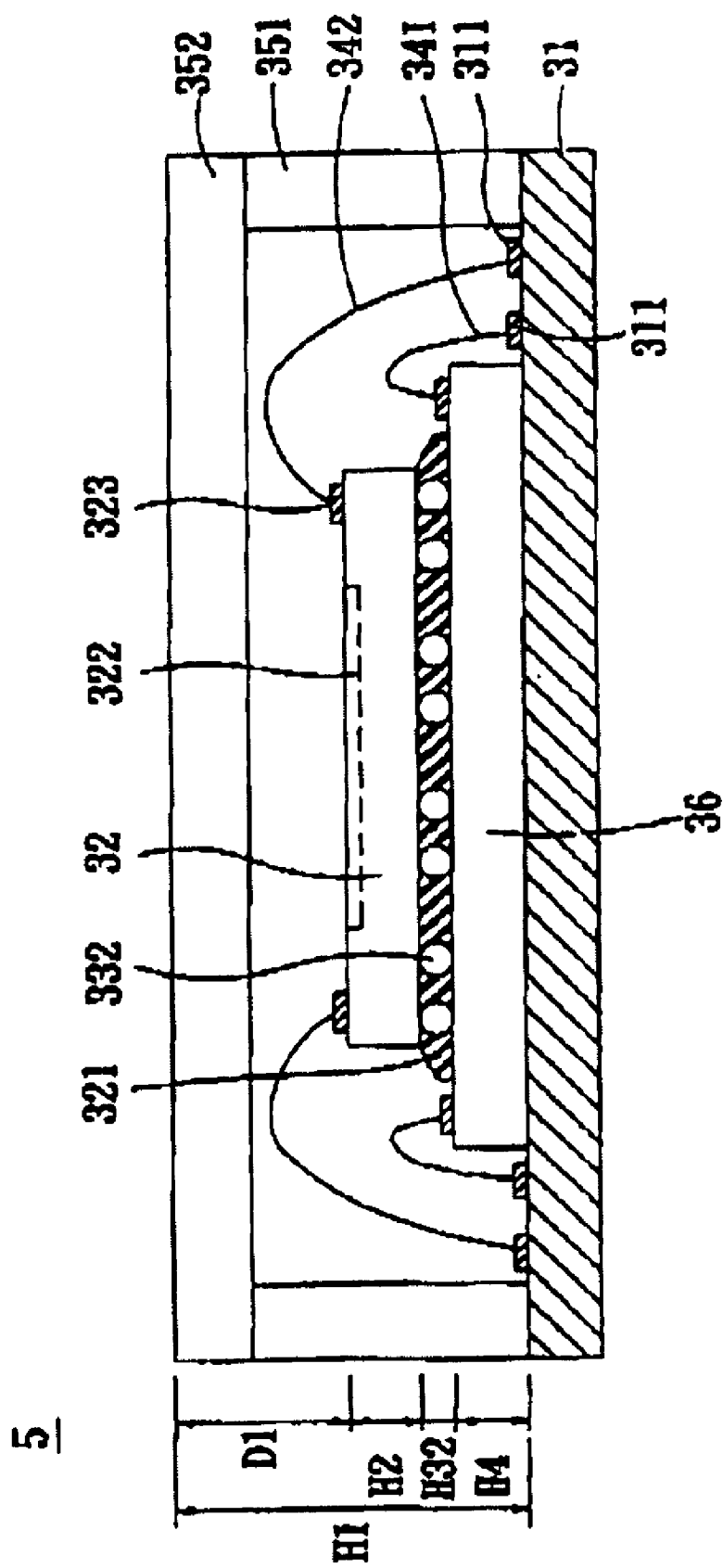
FIGS. 7A and 7B are schematic illustrations showing an optical component package according to an additional preferred embodiment of the invention, which is a stacked optical component package and an optical component is encapsulated with a dam and a transparent lid.
Figure 7B:
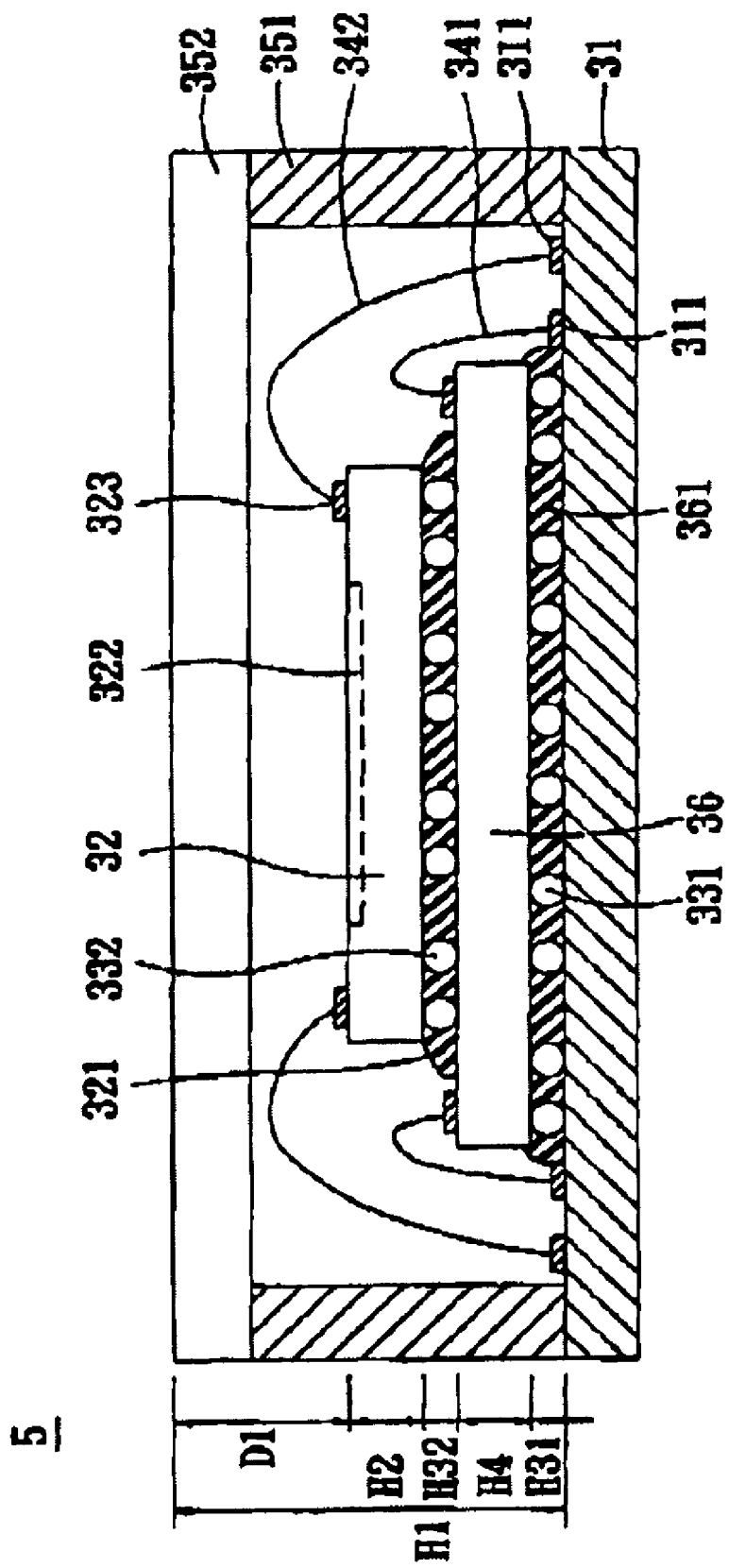

As mentioned above, since the spacers 33 or the first spacers 331 and second spacers 332 have predictable diameters, they can be employed to support the optical component 32 so as to avoid tilting of the optical component 32. Furthermore, the distance D1, which the optical signal passes through in the transparent molding compound 35, can be accurately controlled, so the optical signal can focus exactly on the active zone 322 of the optical component 32. In an additional embodiment, the transparent molding compound 35 can be the previously mentioned dam 351 and transparent lid 352 (as shown in FIGS. 7A and 7B). It should be noted that other elements shown in FIGS. 7A and 7B are the same as those mentioned above which have the same reference numbers.

A packaging method 6 of an optical component package of the invention is described in greater detail with reference to the following embodiment.

Figure 6:
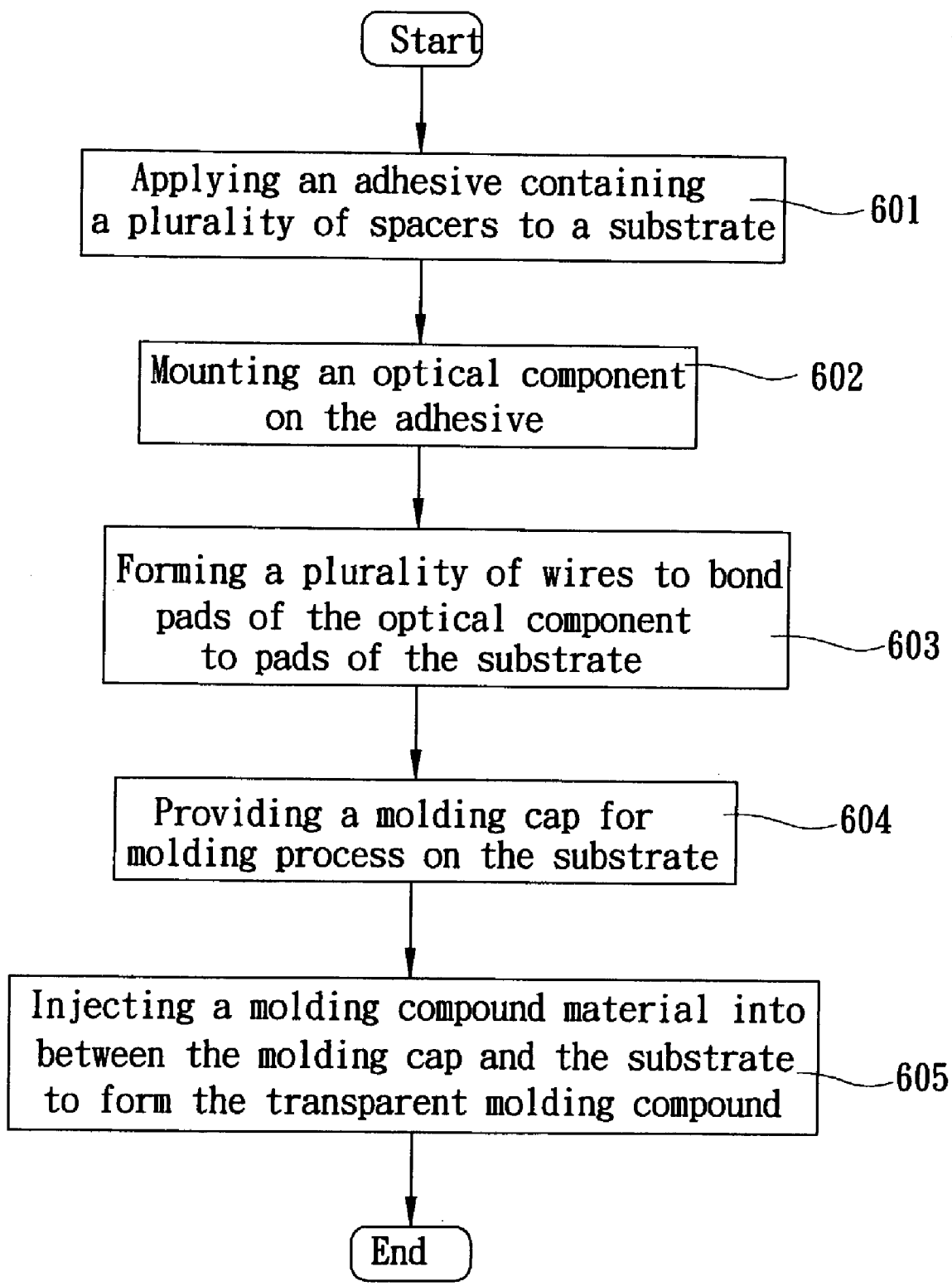
FIG. 6 is a flow chart showing a packaging method of an optical component package according to a preferred embodiment of the invention.

With reference to FIG. 6, in step 601, an adhesive containing a plurality of spacers is formed on a substrate in advance. In the current embodiment, a diameter H3 of each spacer is determined with the above-mentioned equation (1). It should be noted that those skilled in the art can mix the spacers and the adhesive properly, and then apply the adhesive to the substrate. Alternatively, those skilled in the art can apply the adhesive to the substrate, and then place the desired spacers in the adhesive.

Next, in step 602, an optical component is mounted on the adhesive, wherein the active zone of the optical component faces upward. In this case, since the adhesive contains a plurality of spacers, it is sufficient to mount the optical component horizontally. The distance between the optical component and the substrate is equal to the diameter H3 of each spacer.

It should be noted that it is possible the optical component can be manufactured with a backside grinding process before step 602, so that the thickness H2 of the optical component is exactly controlled.

In step 603, a plurality of wires formed with a conventional wire bonding process are used to connect pads of the optical component to the pads of the substrate, so that the substrate and optical component are electrically connected to each other.

In step 604, a molding cap for the molding process is mounted on the substrate. The molding cap has a mold chase for receiving a transparent molding compound. In order to accurately control the thickness H1 of the transparent molding compound, the depth of the molding chase is determined according to the thickness H1. Thus, the depth of the molding chase is equal to H1.

Finally, in step 605, a molding compound material is injected into between the molding cap and the substrate, and then is cured to form the transparent molding compound. In the present embodiment, a molding process and baking process can be used to fill and cure the transparent molding compound. Alternatively, a dam and a transparent lid can be used to encapsulate the optical component. In such a case, the dam encompasses the optical component, and the transparent lid is placed on the dam. The distance between the upper surface of the transparent lid and the upper surface of the optical component is controlled as H1, which is the thickness of the mentioned transparent molding compound. The dam can be made of molding compounds, kovar alloy, or materials similar to the substrate.

As mentioned above, since it is capable to exactly control the thickness H1 of the transparent molding compound, the thickness H2 of the optical component, and the diameter H3 of each spacer, the distance D1, which the optical signal passes through in the transparent molding compound, is predictable. It should be noted that the mentioned steps could be applied to manufacture the previous-mentioned optical component package 5. To manufacture the optical component package 5, a semiconductor component is attached and bonded to a substrate, and an optical component, second wires and a transparent molding compound are then formed in turn.

Since the optical component package and packaging method thereof of the invention employ the spacers with uniform diameters to support the optical component, the optical component can be horizontally provided with the supporting of the spacers. Moreover, since the diameter of each spacer is determined in accordance with the equation (1) or (2), the optical signal can focus on the active zone of the optical component accurately.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An optical component package, comprising:
a substrate;
an optical component disposed on the substrate, wherein one surface of the optical component located away from the substrate receives an optical signal;
a plurality of spacers, which are disposed between the substrate and the optical component;
a plurality of wires electrically connecting the optical component to the substrate; and
a transparent molding compound encapsulating the optical component, wherein a diameter of each of the spacers is equal to a thickness of the transparent molding compound minus a thickness of the optical component minus a distance between where the optical signal enters the transparent molding compound and where the optical signal is received by the optical component.

2. The package of claim 1, wherein the spacers are made of polymer.

3. The package of claim 1, wherein the spacers are made of glass.

4. The package of claim 1, further comprising an adhesive formed between the substrate and the optical component.

5. An optical component package, comprising:
a substrate;
an optical component disposed on the substrate, wherein one surface of the optical component located away from the substrate receives an optical signal;
a plurality of spacers, which are disposed between the substrate and the optical component;
a plurality of wires electrically connecting the optical component to the substrate;
a dam encompassing the optical component; and
a transparent lid, which provided on the dam, wherein a diameter of each of the spacers is equal to a distance between a surface of the transparent lid and a surface of the substrate minus a thickness of the optical component minus a distance between where the optical signal enters the transparent lid and where the optical signal is received by the optical component.

6. The package of claim 5, wherein the spacers are made of polymer.

7. The package of claim 5, wherein the spacers are made of glass.

8. The package of claim 5, wherein the dam is made of Bismaleimide-Triazine.

9. The package of claim 5, further comprising an adhesive formed between the substrate and the optical component.

10. An optical component package, comprising:
a substrate;
a semiconductor component disposed on the substrate;
a plurality of first wires electrically connecting the semiconductor component to the substrate;
an optical component disposed on the semiconductor component, wherein one surface of the optical component located away from the semiconductor component receives an optical signal;
a plurality of spacers, which are disposed between the semiconductor component and the optical component;
a plurality of second wires electrically connecting the optical component to the substrate; and
a transparent molding compound encapsulating the semiconductor component and the optical component, where a diameter of each of the spacers is equal to a thickness of the transparent molding compound minus a thickness of the optical component minus a distance between where the optical signal enters the transparent molding compound and where the optical signal is received by the optical component minus a thickness of the semiconductor component.

11. The package of claim 10, wherein the spacers are made of polymer.

12. The package of claim 10, wherein the spacers are made of glass.

13. The package of claim 10, further comprising:
a first adhesive formed between the substrate and the semiconductor component; and
a second adhesive formed between the semiconductor component and the optical component.

14. The package of claim 10, further comprising:
a plurality of first spacers, which are disposed between the substrate and the semiconductor component, and wherein a diameter of each of said spacers disposed between the semiconductor component and the optical component is equal to a thickness of the transparent molding compound minus a thickness of the optical component minus a distance between where the optical signal enters the transparent molding compound and where the optical signal is received by the optical component minus a thickness of the semiconductor component, minus a diameter of said first spacers.

15. The package of claim 14, further comprising:
a first adhesive formed between the substrate and the semiconductor component; and
a second adhesive formed between the semiconductor component and the optical component, wherein the first spacers are disposed in the first adhesive and the spacers disposed between the substrate and the semiconductor component are disposed in the second adhesive.

16. An optical component package, comprising:
a substrate;
a semiconductor component disposed on the substrate;
a plurality of first wires electrically connecting the semiconductor component to the substrate;
an optical component disposed on the semiconductor component, wherein one surface of the optical component located away from the semiconductor component receives an optical signal;
a plurality of spacers, which are disposed between the semiconductor component and the optical component;
a plurality of second wires electrically connecting the optical component to the substrate;
a dam encompassing the optical component; and
a transparent lid, which is provided on the dam, wherein a diameter of each of the spacers is equal to a distance between a surface of the transparent lid and a surface of the substrate minus a thickness of the optical component minus the distance between where the optical signal enters the transparent lid and where the optical signal is received by the optical component minus a thickness of the semiconductor component.

17. The package of claim 16, wherein the spacers are made of polymer.

18. The package of claim 16, wherein the spacers are made of glass.

19. The package of claim 16, wherein the dam is made of Bismaleimide-Triazine.

20. The package of claim 16, further comprising:
a first adhesive formed between the substrate and the semiconductor component; and
a second adhesive formed between the semiconductor component and the optical component.

* * * * *